(12) United States Patent
Yamazaki et al.

(10) Patent No.: US 6,281,147 B1
(45) Date of Patent: Aug. 28, 2001

(54) PLASMA CVD METHOD

(75) Inventors: Shunpei Yamazaki, Tokyo; Mitsunori Sakama; Masaaki Hiroki, both of Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/457,128

(22) Filed: Dec. 7, 1999

Related U.S. Application Data

(62) Division of application No. 08/748,233, filed on Nov. 12, 1996, now Pat. No. 6,015,762.

(30) Foreign Application Priority Data

Nov. 10, 1995 (JP) ...................................... 7-371524

(51) Int. Cl.[7] .......................... H01L 21/31; H01L 21/469
(52) U.S. Cl. .......................... 438/788; 438/485; 438/787; 438/789; 427/569; 427/579
(58) Field of Search .................................. 438/788, 485, 438/778, 787, 789; 427/569, 579

(56) References Cited

U.S. PATENT DOCUMENTS

| | | | | |
|---|---|---|---|---|
| 4,917,044 | * | 4/1990 | Yau et al. | 118/723 |
| 5,472,825 | * | 12/1995 | Sayka | 420/311 |
| 5,571,578 | * | 11/1996 | Kaji et al. | 427/579 |
| 6,015,762 | * | 1/2000 | Yamazaki et al. | 438/788 |
| 6,103,992 | * | 8/2000 | Noddin | 219/121.71 |
| 6,183,816 | * | 2/2001 | Yamazki et al. | 427/535 |

* cited by examiner

Primary Examiner—John F. Niebling
Assistant Examiner—Alexander G. Ghyka
(74) Attorney, Agent, or Firm—Fish & Richardson P.C.

(57) ABSTRACT

In a process of forming a silicon oxide film 116 that constitutes an interlayer insulating film with TEOS as a raw material through the plasma CVD method, the RF output is oscillated at 50 W, and the RF output is gradually increased from 50 W to 250 W (an output value at the time of forming a film) after discharging (after the generation of $O_2$-plasma). A TEOS gas is supplied to start the film formation simultaneously when the RF output becomes 250 W, or while the timing is shifted. As a result, because the RF power supply is oscillated at a low output when starting discharging, a voltage between the RF electrodes can be prevented from changing transitionally and largely.

63 Claims, 7 Drawing Sheets

PLASMA CVD METHOD

This is a divisional of U.S. application Ser. No. 08/748,233, filed Nov. 12, 1996, U.S. Pat. No. 6,015,762.

BACKGROUND OF THE INVENTION

1. Field of the Invention

The present invention relates to a plasma CVD method used for manufacturing a semiconductor integrated circuit such as a thin-film transistor.

2. Description of the Related Art

At the present time, as the semiconductor integrated circuit is made high in integration as well as density, there is advanced that the structure of a semiconductor element is made finer. Under this condition, there is such a demand that an interlayer insulating film not only has an insulating characteristic, but also can be filled closely between wires which are complicated and have high aspects. Up to now, since a silicon oxide film which is made of TEOS as raw material and formed through the CVD method is excellent in coating shape, it has been widely used as an interlayer insulating film. In particular, the plasma CVD method is applied since it enables the silicon oxide film to be manufactured at a low temperature of 400° C. or lower and also enables a large area to be processed, in a process of manufacturing a TFT which is to be formed on a glass substrate.

However, as the semiconductor integrated circuit is made high in integration as well as density, the influence of charge-up of electrons caused during a plasma process becomes remarkable. For example, it is presumed that the failure of U-shaped display and the defect of points are caused by electric damages during the process. In the active matrix type liquid-crystal display unit, the failure of one TFT means the failure of an entire panel, thereby leading to the deterioration of a yield.

SUMMARY OF THE INVENTION

In order to eliminate the above problem, an object of the present invention is to provide a plasma CVD method that is capable of suppressing the deterioration of a device which is caused by charge particles.

The process by which the present invention has been achieved will be described.

In the plasma CVD device, in a state before plasma is developed, a voltage applied from an RF electrode acts as an electric field for a substrate. It is presumed from the viewpoints of an interval between an electrode and a wire, the thickness of a substrate, etc., that in this state, the intensity of an electric field is not so much as a device formed on the substrate is destroyed.

On the other hand, due to charge particles (electrons and positive ions) are produced in the process of generating plasma, a space between the RF electrodes becomes conductive. A substrate surface starts to be negatively charged with respect to plasma due to a difference in mobility between electrons and positive ions (the generation of ion sheath). Thereafter, the amount of generation of charge particles is balanced with the amount of disappearance of charge particles, that is, the amount of charge-up of charge particles is saturated, resulting in a stationary plasma state.

Hence, it is presumed that because the ion sheath produced on the substrate surface is not considered to become an excessively value, the intensity of electric field and ion irradiation energy are not so much as they destroy the device.

However, there is the possibility of allowing current to flow in a portion where little current flows in the stationary state until the amount of charge-up is saturated in a moment when plasma is generated, and if a large current flows in that portion transitionally, the device is then destroyed instantly.

Up to now, in order to form a silicon oxide film which is made of TEOS as raw material through plasma CVD, two processes consisting of a pre-process for generating plasma and a process of supplying TEOS to form the film are continuously conducted (in a state where $O_2$ plasma is being generated).

To elucidate the transitional phenomenon in the plasma CVD, the present inventors, et al. have observed the waveform of voltage applied between the RF electrodes with the connection of an oscilloscope to an RF power supply. FIG. 5 shows the waveform of voltage applied between the RF electrodes in a conventional film forming process, and the unit of a vertical axis is 200 V/div whereas the unit of a horizontal axis is 500 msec/div. In both of the plasma generating process and the film forming process, an RF output is 250 W. FIGS. 6A to 6C show the waveforms of voltage applied between the RF electrodes in an $O_2$ plasma generating process where the RF output is 250 W. FIG. 6A shows the waveform at the time of starting oscillation, and FIGS. 6B and 6C show the waveforms at the time of starting discharge, respectively. The instant that the discharge starts can be recognized as the shift of waveforms. It should be noted that the unit of the vertical axis of FIGS. 6A to 6C is 200 V/div, respectively, whereas the unit of the horizontal axis is 100 msec/div in FIG. 6A, 20 msec/div in FIG. 6B, and 2 msec/div in FIG. 6C.

Although the RF power supply oscillates at a predetermined voltage immediately after starting oscillation, a period of several tens msec is required from the oscillation start to the discharge start. However, a large voltage waveform (hereinafter referred to "beard pulse") was transitionally observed in the moment that discharge is started as shown in FIG. 6C although it cannot be recognized in FIGS. 5, 6A and 6B.

For example, consideration is made about the plasma CVD process of a TFT disposed on a pixel panel of the active matrix type display unit. In order to surely hold image data, there is required that the TFT of the pixel panel is excellent in off-state current characteristic. For that reason, the TFT comprises, for example, the LDD structure, as shown in FIG. 1E. Because the LDD region functions as a high resistant region, the off-state current can be reduced. It should be noted that FIG. 1 will be described in detail with reference to a first embodiment.

In the process of manufacturing the TFT with the LDD structure, source/drain regions 112 and 113 of an active layer 103 which is made of silicon are exposed as shown in FIG. 1E before forming a first interlayer insulating film 116 (refer to FIG. 1F). Also, because a gate electrode 105 is not cut into respective devices, its length is substantially identical with the width of a substrate as it is, and about several hundreds of gate electrodes 105 with the above structure are disposed in parallel.

In the above state, in the case where the first interlayer insulating film 116 is formed through plasma CVD, unless the plasma density and the plasma potential are not uniform even in the stationary plasma state, gate potential is distributed so that a current flows in the gate electrode 105, with the result that the device is deteriorated. However, in the moment that plasma is generated, a transitional beard pulse is generated as shown in FIG. 6C. Further, if plasma is unevenly generated, then a current which is remarkably larger than that in the stationary state is allowed to flow in the gate electrode.

Moreover, in an initial stage of forming the first interlayer 116, because electrons are irradiated directly onto silicon (source/drain regions 112 and 113), silicon is negatively charged. As a result, because electric field is developed in the gate insulating film 110, the gate insulating film 110 is deteriorated. However, if silicon (source/drain regions 112 and 113) is covered with the first interlayer insulating film 116, silicon is prevented from being directly charged up.

Therefore, in order to form the first interlayer insulating film through plasma CVD, there arises such a problem that a transitional change in voltage such as the beard pulse must be eliminated or suppressed between the RF electrodes until silicon finishes being charged up.

In order to solve the above problem, according to a first aspect of the present invention, there is provided a plasma CVD method that increases gradually or continuously an output of an RF power supply up to a value which is at the time of forming a film.

According to a second aspect of the present invention, there is provided a plasma CVD method that continuously implements a step of generating plasma from gas other than a raw gas, and a step of supplying said raw gas to form a film, wherein, in said plasma generating step, the output of the RF power supply is gradually or continuously increased up to a value which is in said film forming step.

In the conventional example, to form the silicon oxide film with TEOS as a raw material, the RF power supply is oscillated during the $O_2$-plasma generation at the same output value as that during the film formation. As shown in FIG. 6A, a predetermined voltage is applied between the RF electrodes immediately after oscillation starts. In other words, a voltage between the RF electrodes is rapidly changed.

For that reason, in the plasma CVD method with the above steps according to the first aspect of the present invention, the output of the RF power supply is gradually or continuously increased up to the value which is required at the time of forming the film, thereby restraining a rapid and transitional change in voltage between the RF electrodes.

For example, in order to form the silicon oxide film with TEOS as a raw material through plasma CVD, a step of generating plasma of $O_2$ and a step of supplying TEOS and generating plasma of TEOS/$O_2$ to form a film are continuously conducted. Therefore, according to the second aspect of the present invention, in the plasma CVD method that continuously implements the step of generating plasma of gas ($O_2$) other than the raw gas and the step of supplying the raw gas (TEOS) to form a film, in the plasma generating step when oscillation starts, the output of the RF power supply is gradually or continuously increased up to a value which is in the film forming step, thereby suppressing a rapid and transitional change in voltage between the RF electrodes.

It should be noted that, in the plasma generating step, the raw gas may be supplied simultaneously when the output of the RF power supply becomes identical with the value which is at the time of forming the film. Alternatively, the raw gas may be supplied while shifting a timing at which the output of the RF power supply becomes identical with the value which is at the time of forming the film. Further, the lower limit of the RF output when oscillation starts can be defined by a dischargeable value.

On the other hand, the upper limit of the RF output when oscillation starts may be appropriately set for each device or each reaction chamber. This is because, according to the inventors' research, there is a case where no transitional change in voltage between the RF electrodes is observed, and also the probability of occurrence of the transitional phenomenon depends on each device or each reaction chamber.

However, the voltage of the RF power when oscillation starts is half or less of the voltage of the RF power when material gas supplies.

FIGS. 3A to 3C show the waveforms of a voltage applied between the RF electrodes during the $O_2$-plasma generating step when the output of the RF power supply is 50 W, which has been observed through an oscilloscope by the present inventors. FIG. 3A shows a voltage waveform from the time point of starting oscillation and after starting discharge. FIGS. 3B and 3C show voltage waveforms at the time of starting discharge. The moment at which discharge starts is recognizable as a shift of the waveform. It should be noted that the unit of the vertical axis of FIGS. 3A to 3C is 200 V/div, respectively, whereas the unit of the horizontal axis is 100 msec/div in FIG. 3A, 20 msec/div in FIG. 3B, and 2 msec/div in FIG. 3C.

As is apparent from comparison of FIGS. 3A to 3C with FIGS. 6A to 6C, the RF output is set to 50 W which is lower than 250 W (voltage when forming a film) when discharge starts, thereby suppressing the rapid and transitional change in voltage such as the beard pulse at the time of starting discharge (at the time of generating plasma of $O_2$).

FIGS. 4A and 4B show the waveforms of a voltage applied between the RF electrodes during the $O_2$-plasma generating step, which has been observed through an oscilloscope, in which the RF output is set to 50 W when oscillation starts, and is then increased to 250 W after discharging. FIG. 4A shows a voltage waveform from oscillation starts and then discharge starts, and FIG. 4B shows a voltage waveform at the time of increasing the RF output. The moment at which discharge starts is recognizable as a shift of the waveform. It should be noted that the unit of the vertical axis of FIGS. 4A and 4B is 200 V/div, respectively, whereas the unit of the horizontal axis is 1 msec/div in FIG. 4A, and 2 msec/div in FIG. 4B. As shown in FIG. 4B, the RF output is gradually increased from 50 W to 250 W after discharging (after the generation of $O_2$ plasma), to thereby smoothly increase a voltage between the RF electrodes, thus being capable of suppressing the transitional change in voltage.

DETAILED DESCRIPTION OF THE PREFERRED EMBODIMENTS

Now, a description will be given in more detail of embodiments according to the present invention with reference to the accompanying drawings.

(First Embodiment)

Figure 1A:
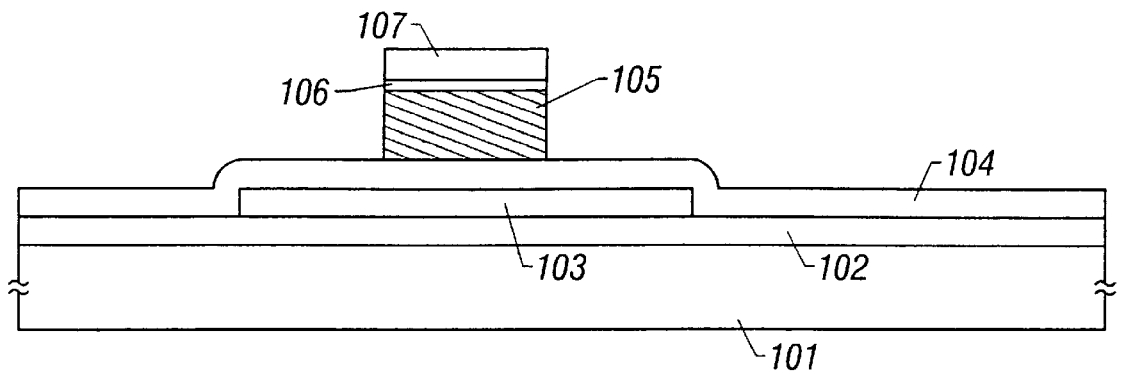
FIGS. 1A, 1B, 1C, 1D, 1E, and 1F are cross-sectional views showing a process of manufacturing a TFT in accordance with a first embodiment.

A first embodiment is directed to the present invention applied to a process of manufacturing a TFT, and FIGS. 1A to 1F show cross-sectional views of a TFT in each process of manufacturing a TFT in accordance with this embodiment. As shown in FIG. 1A, a silicon oxide film 102 with a thickness of 3000 Å is deposited on a glass substrate (Corning 1737) 101 as an under film through plasma CVD or sputtering. Then, an amorphous silicon film with a thickness of 200 to 1500 Å, for example, 500 Å is formed on the silicon oxide film 102 through plasma CVD method or the reduced pressure CVD.

Thereafter, the amorphous silicon film is thermally annealed so as to be crystallized. The crystallized amorphous silicon film is etched to form an active layer 103 of a TFT. As a method of crystallizing the amorphous silicon film, there can be adopted a laser annealing method or a method of conducting thermal annealing and laser annealing together. If using a metal element that promotes the crystallization of silicon, such as Ni or Pt, the crystallizing process can be conducted at a lower temperature and a shorter period of time.

Then, an aluminum film with a thickness of 6000 Å that constitutes a gate electrode 105 is deposited through sputtering. The aluminum film contains scandium of 0.1 to 0.3 weight % therein. Then, an anodization (aluminum oxide) layer 106 is formed on the surface of the aluminum film through anodization. In this situation, a voltage of 10 to 30 V is applied to the aluminum film in an ethylene glycol solution containing tartaric acid of 3% therein. The anodization layer 106 thus formed has a fine (barrier-type) structure. Then, a resist mask 107 is formed on the surface of the anodization layer 106, and the aluminum film is patterned to form a gate electrode 105 (FIG. 1A).

Figure 1B:
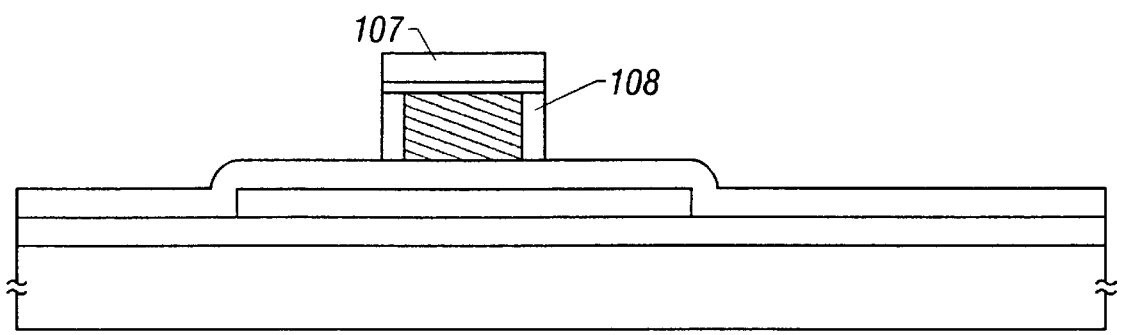

As shown in FIG. 1B, a constant voltage of 10 to 30 V is applied to the gate electrode 105 in the electrolyte solution while the resist mask 107 is attached to the anodization layer, to thereby conduct anodization. As the electrolyte solution, there can be used an acid solution in which citric acid, oxalic acid or sulfuric acid is diluted to 3 to 20%. In this embodiment, a voltage of 10 V is applied to the gate electrode 107 in oxalic acid solution (30° C.) for 20 to 40 minutes. As a result, a porous type anodic oxide 108 with a thickness of 5000 Å is formed on only sides of the gate electrode 105. It should be noted that the thickness of the oxidation 108 may be controlled by oxidation time (FIG. 1B).

Figure 1C:
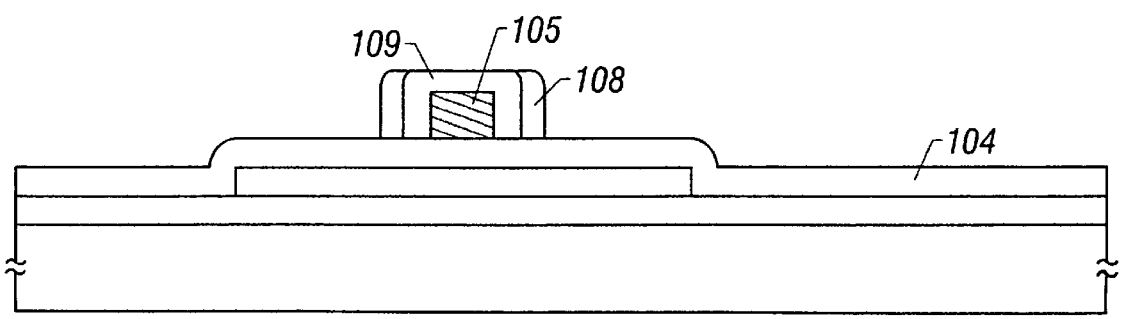

As shown in FIG. 1C, the resist mask 107 is removed to secondly anodize the gate electrode 105 in the electrolyte solution. In this situation, an ethylene glycol solution containing 3 to 10% of tartaric acid, boric acid, or sulfuric acid is used. As a result, a barrier type anodic oxide 109 is formed in the periphery of the gate electrode 105. The thickness of the barrier type anodic oxide 109 is set to 1500 to 2000 Å. The thickness of the anodic oxide 109 may be appropriately determined by the length of an offset and overlapping. The thickness of the barrier type anodic oxide 109 is nearly proportional to a supply voltage, and when the supply voltage is 200 V, the thickness of the anodic oxide 109 is 2500 Å.

Figure 1D:
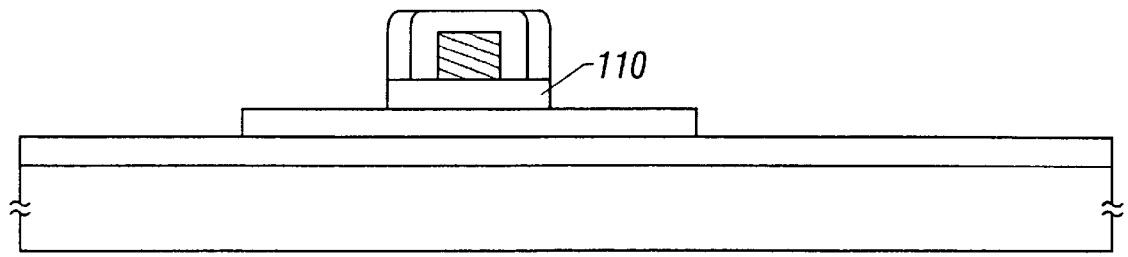

Then, with the anodic oxides 108 and 109 as masks, the silicon oxide film 104 is etched to form a gate insulating film 110. For example, if $CF_4$ is used as an etching gas, only the silicon oxide film 104 can be etched and the porous anodic oxide 108 not being etched (FIG. 1D).

Figure 1E:
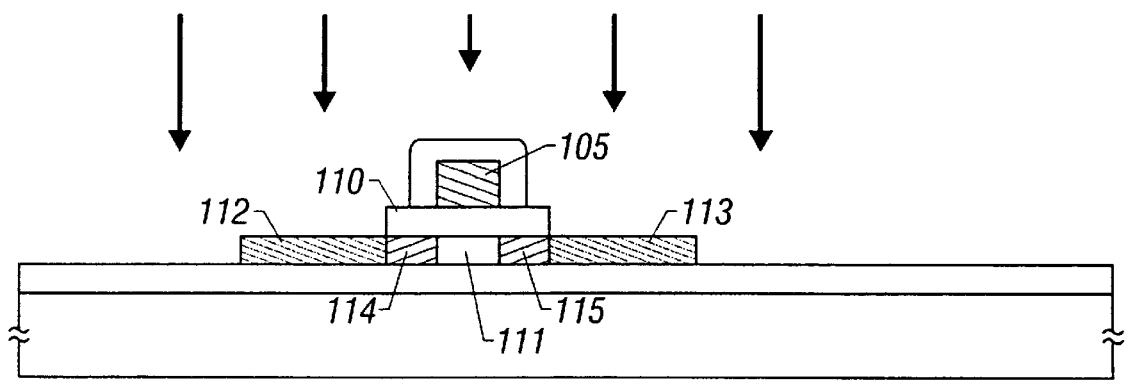

As shown in FIG. 1E, impurity ions that give conductive type is implanted into the active layer 103. In the case of forming a p-type TFT, p (phosphorus) ions are implanted into the active layer 103, but in the case of forming an n-type TFT, B (boron) ions are implanted thereinto. Also, in order to make the gate insulating film 110 function as a semi-transmission mask, such conditions as the dose amount or the acceleration voltage are appropriately set.

As a result, in the active layer 103, the gate electrode 105 functions as a complete mask, and a region just below the gate electrode 105 forms a channel formation region 111, into which no impurity ions are implanted. Also, exposed regions of the active layer 103 form a source region 112 and a drain region 113 because impurity ions with a high density are implanted into the exposed regions of the active layer 103. Regions which are covered with only the gate insulating film 110 form low-density impurity regions 114 and 115 which are lower in density of impurity ions than the source region 112 and the drain region 113 because the gate insulating film 110 functions as a semi-transmission mask when ion implanting. In particular, a low-density impurity region 115 between the channel formation region 111 and the drain region 113 is called "LDD region". The impurity density of the low-density impurity regions 114 and 115 may be set to be lower than that of the source/drain regions 112 and 113 by about 2 figures (FIG. 1E).

Figure 6A:
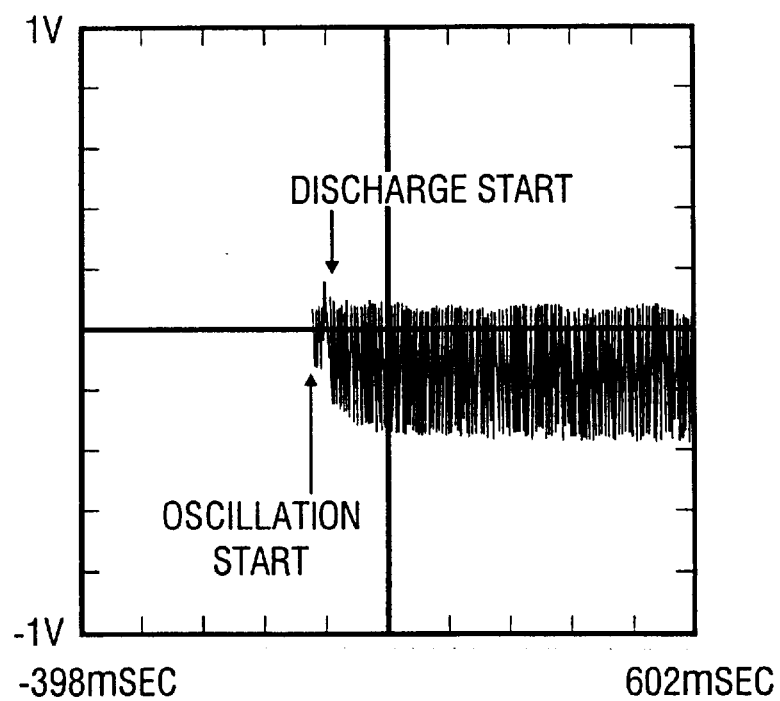
FIGS. 6A–6C are a diagram showing the waveform of a voltage applied between the RF electrodes during a process of generating $O_2$-plasma.
Figure 6B:
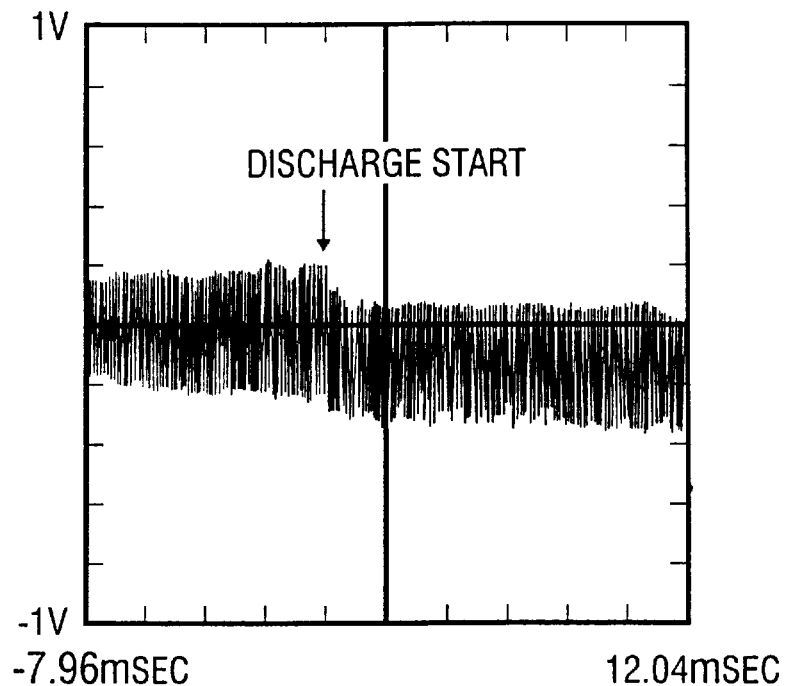
Figure 6C:
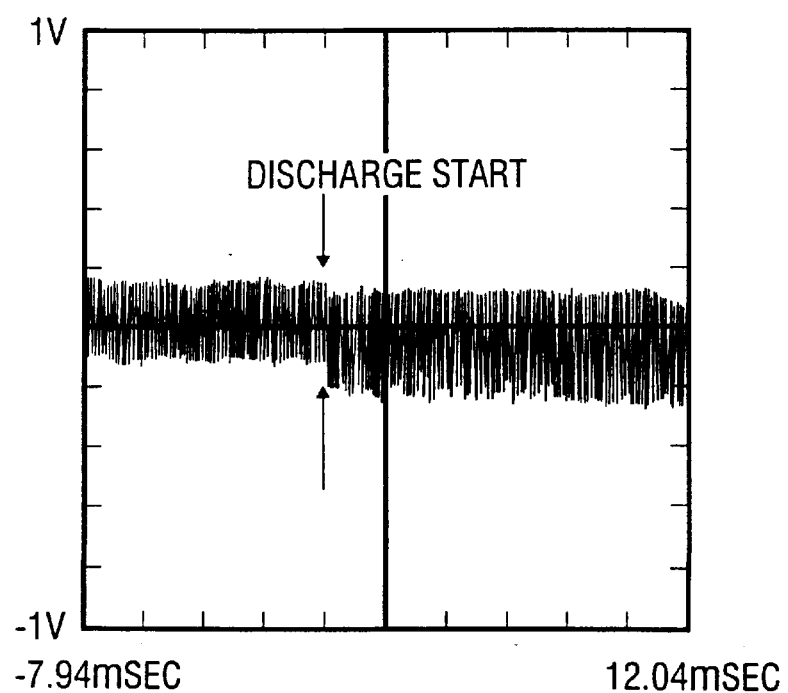

Subsequently, a silicon oxide film 116 with a thickness of 5000 Å is deposited as an interlayer insulator with a raw material of TEOS through plasma CVD. In this embodiment, in order that the beards pulse as shown in FIG. 6C is eliminated or suppressed between the RF electrodes in the initial stage of forming a film, the output of the RF power supply in a plasma CVD device is gradually increased. For that reason, the RF output is first set to 50 W to generate $O_2$ plasma. Thereafter, simultaneously when the RF output is increased to 250 W, TEOS gas is supplied to generate TEOS/$O_2$ plasma, thereby forming a silicon oxide film 116.

Figure 2:
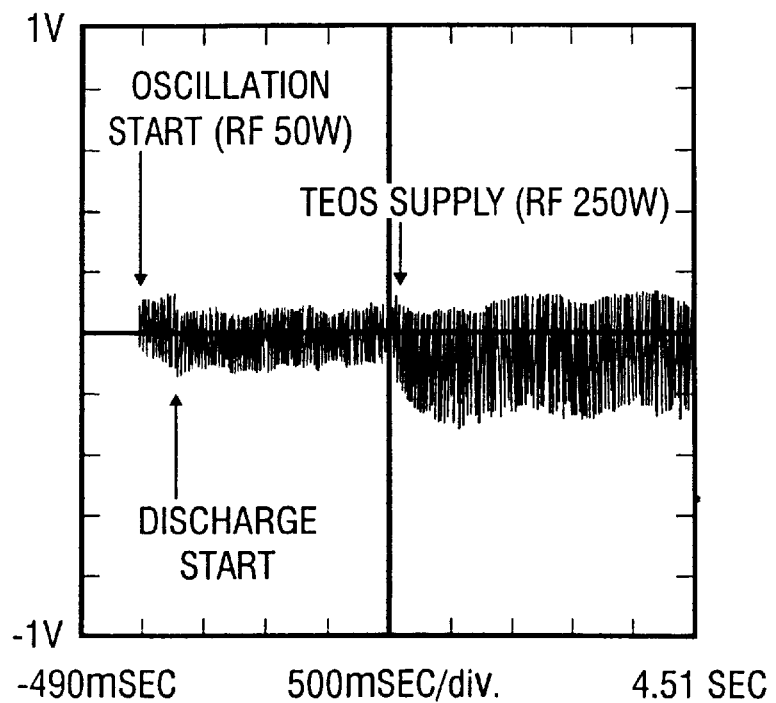
FIG. 2 is a diagram showing the waveform of a voltage applied between RF electrodes when forming a silicon oxide film.
Figure 3A:
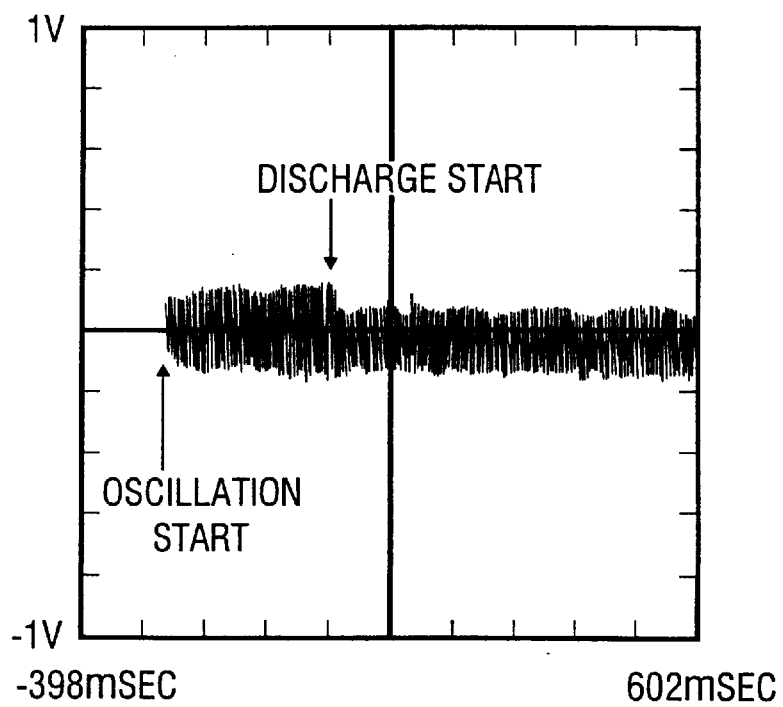
FIGS. 3A, 3B and 3C are diagrams showing the waveform of a voltage applied between the RF electrodes when generating $O_2$ plasma.
Figure 3B:
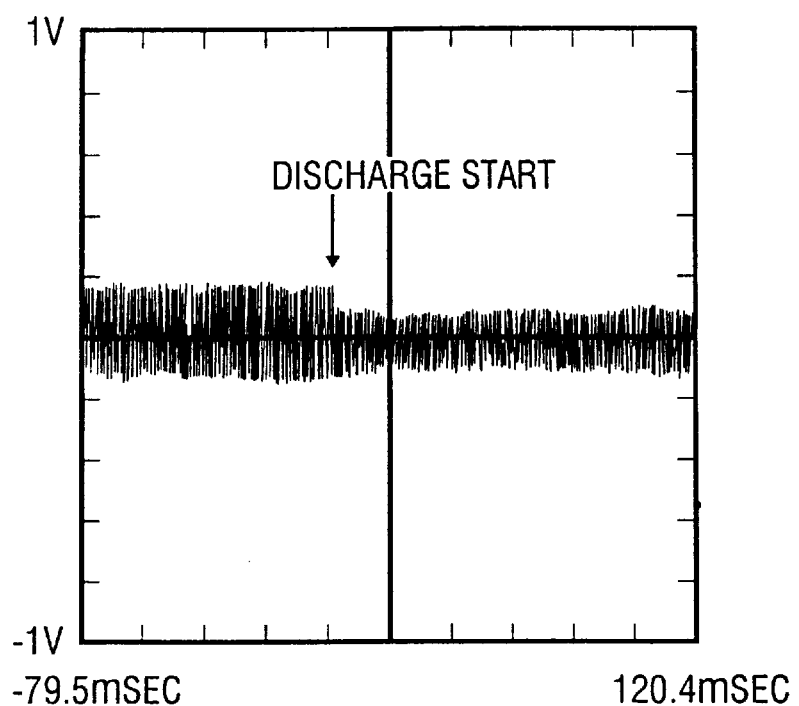
Figure 3C:
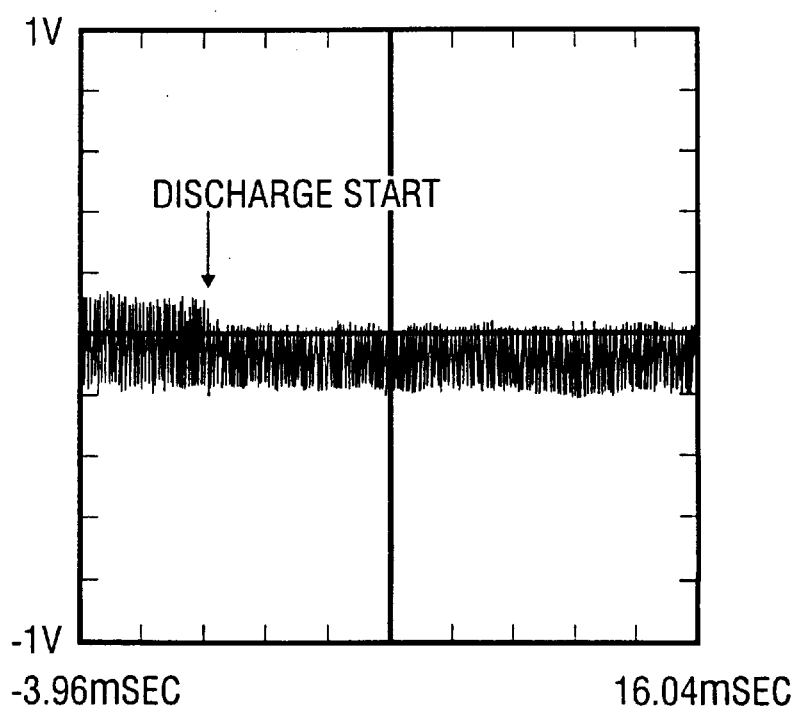

FIG. 2 is a diagram showing the waveform of a voltage applied between the RF electrodes when forming the silicon oxide film 116 which has been observed through an oscilloscope, and FIGS. 3A to 3C are waveforms of a voltage applied between the RF electrodes during the $O_2$-plasma generation process. FIG. 3A is a voltage waveform from the time of starting oscillation and then discharge starts, and FIGS. 3B and 3C are waveforms of a voltage at the time of starting discharge. The moment at which discharge starts is recognizable as a shift of the waveform. It should be noted that the unit of the vertical axis of FIGS. 3A to 3c is 200 V/div, respectively, whereas the unit of the horizontal axis is 100 msec/div in FIG. 3A, 20 msec/div in FIG. 3B, and 2 msec/div in FIG. 3C.

Conventionally, because, in the $O_2$ plasma generation, the RF power supply is oscillated at a high output as in the film formation, the beard pulse has been observed as shown in FIG. 6C. In this embodiment, because the RF power supply is oscillated at a low output such as 50 W, the generation of the beard pulse can be suppressed at the time of starting discharge as shown in FIG. 3C. Therefore, because no large voltage is transitionally applied to the RF electrodes, the device on the substrate 101, in particular, the deterioration of the gate insulating film 110 can be suppressed.

It should be noted that in the present invention, the RF output is gradually increased from 50 W to 250 W and then TEOS supply start. Alternatively, the RF output may be continuously increased from 50 W to 250 W after discharging (after O₂ plasma is generated). In this case, in comparison with the case where the RF output is gradually increased, a abruptly change in voltage between the RF electrodes can be more suppressed. Also, when the RF power supply of the plasma CVD device is subjected to lamp-up (slow start), the transitional fluctuation of voltage can be further suppressed between the RF electrodes.

Figure 1F:
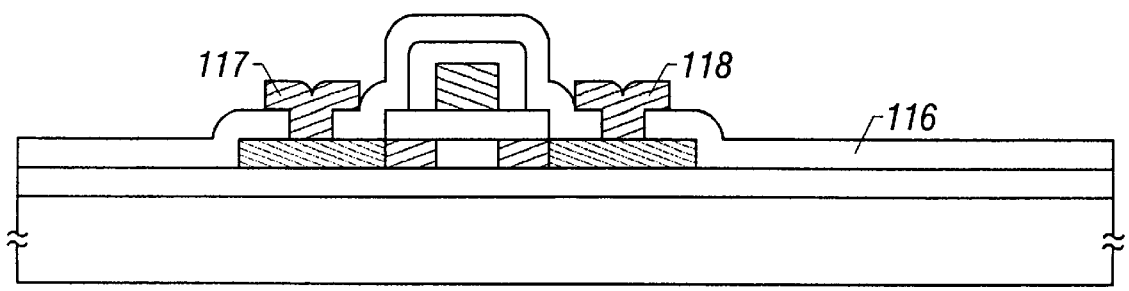

As shown in FIG. 1F, contact holes are formed after forming the silicon oxide film 116, a titanium film and an aluminum film are continuously formed and patterned to form source/drain electrode/wiring 117 and 118. Through the above processes, a TFT having the LDD structure is fabricated.

In this embodiment, the process of forming the silicon oxide film 116 which constitutes an interlayer insulating film has been described. Similarly, in other plasma CVD process, for example, in the process of forming the silicon oxide film 102 that constitutes the gate insulating film 110, a film may be formed while the RF output is controlled as described above.

(Second Embodiment)

In the first embodiment, when forming the silicon oxide film 116, the RF output is reduced during the O₂ plasma generation process, and the RF output is increased to a predetermined value simultaneously when TEOS is supplied. In this embodiment, the RF output is increased to the same value as that of forming a film. In other words, in this embodiment, the RF power supply is oscillated at an output of 50 W to generate O₂ plasma. After a predetermined period of time has elapsed, the RF output is increased up to 250 W, and then TEOS is supplied to start the film formation.

Figure 4A:
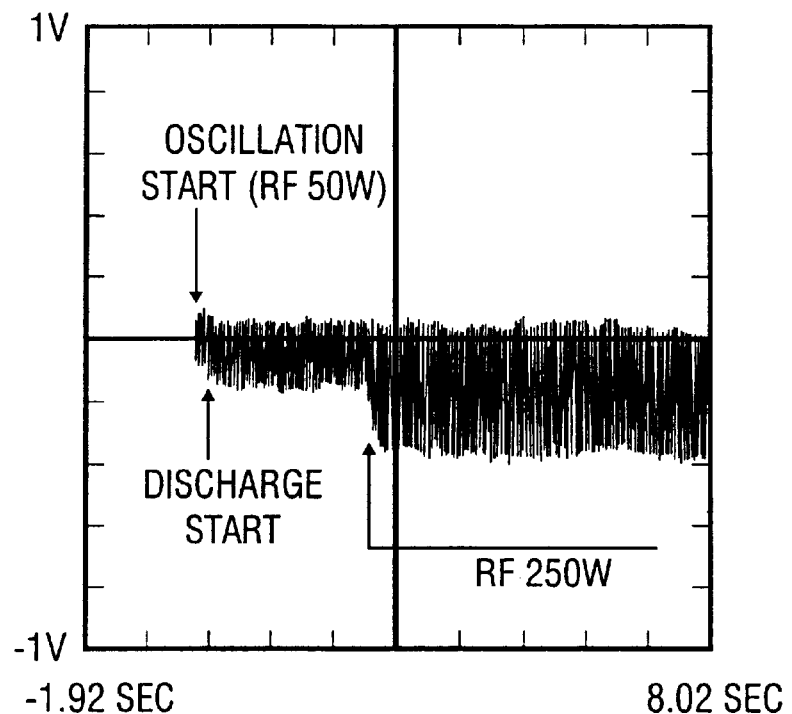
FIGS. 4A and 4B are diagrams showing the waveform of a voltage applied between the RF electrodes when generating $O_2$ plasma in accordance with a second embodiment.
Figure 4B:
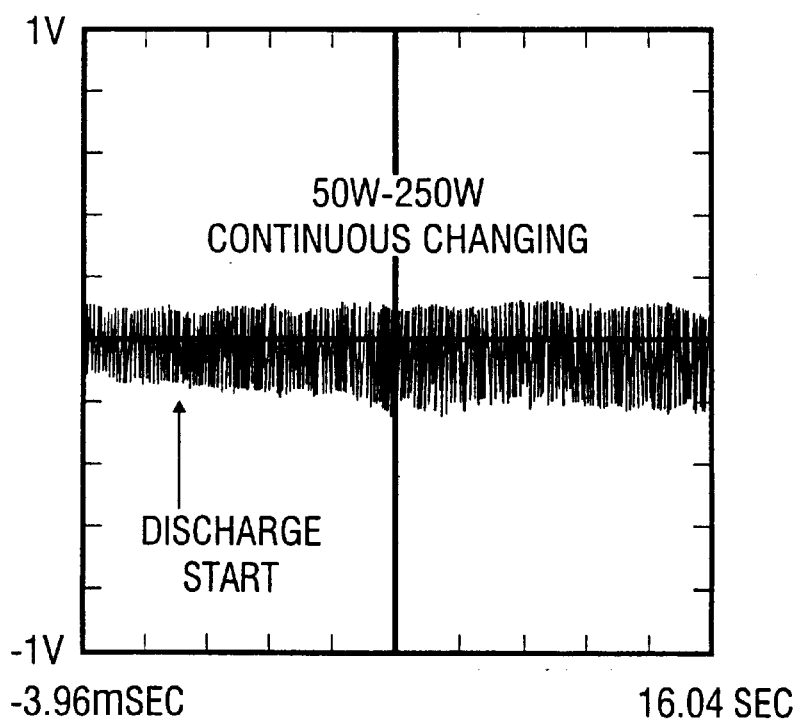
Figure 5:
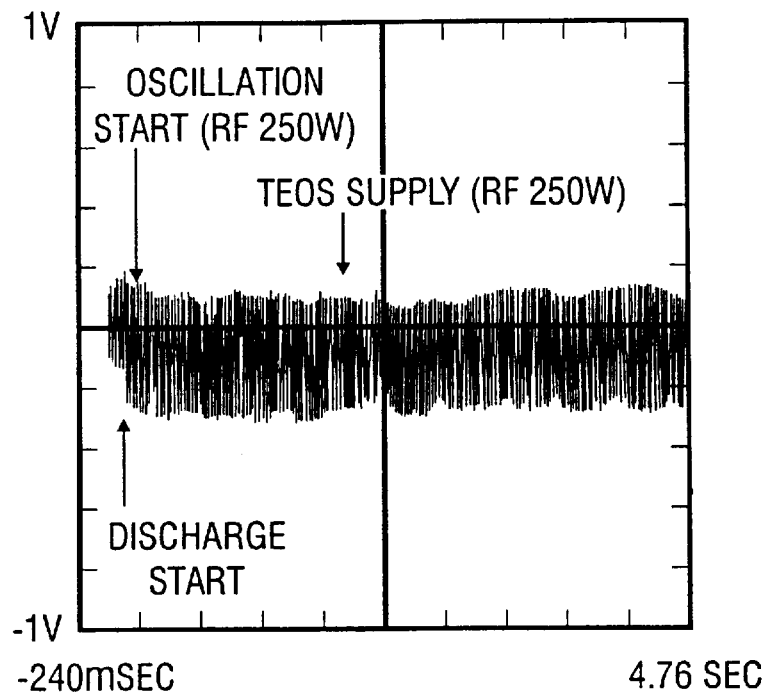
FIG. 5 is a diagram showing the waveform of a voltage applied between the RF electrodes when forming a silicon oxide film in accordance with a conventional example.

FIGS. 4A and 4B are diagrams showing the waveform of a voltage applied between the RF electrodes when forming the silicon oxide film according to this embodiment which has been observed through an oscilloscope, which is a voltage waveform during O₂ plasma generation. FIG. 4A shows a voltage waveform from oscillation starts and then discharge starts, and FIG. 4B shows a voltage waveform at the time where the RF output is increased from 50 W to 250 W. The moment at which discharge starts is recognizable as a shift of the waveform. In this embodiment, because O₂-plasma is generated when the RF output is 50 W as in the first embodiment, no beard pulse is observed before and after discharge starts although being not recognizable in FIG. 4A. Also, although the RF output is increased from 50 W to 250 W after discharging, a voltage between the RF electrodes is smoothly increased to cause no transitional change in voltage as shown in FIG. 4B.

Therefore, with the application of the process of forming the film through plasma CVD in accordance with this embodiment, an electric stress can be prevented from applying to the device on a substrate.

It should be noted that in the present invention, the RF output is gradually increased from 50 W to 250 W after discharging (after the generation of O₂-plasma) during the O₂-plasma generation process. Alternatively, the RF output may be continuously increased from 50 W to 250 W after discharging (after O₂-plasma is generated). In this case, in comparison with the case where the RF output is gradually increased, a change in voltage between the RF electrodes can be more suppressed. Also, when the RF power supply of the plasma CVD device is subjected to lamp-up (slow start), the transitional fluctuation of voltage can be further suppressed between the RF electrodes.

Also, in this specification, the process of manufacturing the TFT on the glass substrate has been described. However, it can be applied to a process of fabricating a semiconductor device/circuit prepared on a silicon wafer.

As was described above, according to the plasma CVD method of the present invention, because the RF power supply starts to be oscillated at an output lower than that when forming a film, a voltage between the RF electrodes when starting discharge can be prevented from changing transitionally and drastically. Hence, because the devices that fail during the plasma CVD process are reduced, the yield can be improved.

Further, the present invention can be readily realized by only changing a method of controlling the RF power supply in the plasma CVD device, for example, by changing the RF voltage.

What is claimed is:

1. A method of manufacturing a semiconductor device in which a step of forming an insulating film by plasma CVD method comprising steps of:

preparing a substrate having a surface to be treated in a reaction chamber;

generating an ion sheath on said surface to be treated by applying an RF power having a first voltage, thereby amount of charge-up on the surface to be treated is saturated;

increasing said RF power from said first voltage to a second voltage; and supplying an organic silane gas in the chamber at the same time when or after said RF power reaches to the second voltage, thereby said insulating film are formed on said surface to be treated, wherein said first voltage is a value so that a transitional current does not flow in or on said surface to be treated until the amount of the charge-up is saturated, and wherein said second voltage is a sufficient value to decompose the organic silane.

2. A method according to claim 1, wherein the voltage of said RF power is increased from said first voltage to said second voltage continuously.

3. A method according to claim 1, wherein the voltage of said RF power is increased from said first voltage to said second voltage in a step-like manner.

4. A method according to claim 1, wherein said first voltage of the RF power is half or less than said second voltage of the RF power.

5. A method according to claim 1, wherein said first voltage of the RF power is 50 W and said second voltage of the RF power is 250 W.

6. A method according to claim 1, wherein said organic silane comprises tetraethoxysilane.

7. A method according to claim 1, wherein said insulating film is a silicon dioxide film.

8. A method of manufacturing a semiconductor device in which a step of forming an insulating film by plasma CVD method comprising steps of:

preparing a substrate having a surface to be treated in a reaction chamber;

generating plasma of a first gas by applying an RF power having a first voltage;

increasing said RF power from said first voltage to a second voltage; and supplying a second gas in the chamber at the same time when or after said RF power reaches to the second voltage, thereby said insulating film are formed on said surface to be treated, wherein said first voltage is a value so that a transitional current does not flow in or on said surface to be treated until the plasma of the first gas reaches a stationary state, and wherein said second voltage is a sufficient value to form said insulating film over said substrate.

9. A method according to claim 8, wherein the voltage of said RF power is increased from said first voltage to said second voltage continuously.

10. A method according to claim 8, wherein the voltage of said RF power is increased from said first voltage to said second voltage in a step-like manner.

11. A method according to claim 8, wherein said first voltage of the RF power is half or less than said second voltage of the RF power.

12. A method according to claim 8, wherein said first voltage of the RF power is 50 W and said second voltage of the RF power is 250 W.

13. A method according to claim 8, wherein said first gas comprises oxygen.

14. A method according to claim 8, wherein said second gas comprises tetraethoxysilane.

15. A method according to claim 8, wherein said insulating film is a silicon dioxide film.

16. A method of manufacturing a semiconductor device in which a step of forming an insulating film by plasma CVD method comprising steps of:
   preparing a substrate having a surface to be treated in a reaction chamber;
   generating oxygen plasma by applying an RF power having a first voltage;
   increasing said RF power from said first voltage to a second voltage; and
   supplying tetraethoxysilane gas in the chamber at the same time when or after said RF power reaches to the second voltage, thereby said insulating film are formed on said surface to be treated,
   wherein said first voltage is a value so that a transitional beard pulse is not observed in voltage waveforms in the moment that the oxygen plasma is generated, and
   wherein said second voltage is a sufficient value to generate tetraethoxysilane/oxygen plasma.

17. A method according to claim 16, wherein the voltage of said RF power is increased from said first voltage to said second voltage continuously.

18. A method according to claim 16, wherein the voltage of said RF power is increased from said first voltage to said second voltage in a step-like manner.

19. A method according to claim 16, wherein said first voltage of the RF power is half or less than said second voltage of the RF power.

20. A method according to claim 16, wherein said first voltage of the RF power is 50 W and said second voltage of the RF power is 250 W.

21. A method according to claim 16, wherein said insulating film is a silicon dioxide film.

22. A method of manufacturing an active matrix type display device in which a step of forming an insulating film by plasma CVD method comprising steps of:
   preparing a substrate having a surface to be treated in a reaction chamber;
   generating an ion sheath of oxygen on said surface to be treated by applying an RF power having a first voltage, thereby amount of charge-up on the surface to be treated is saturated;
   increasing said RF power from said first voltage to a second voltage; and
   supplying an organic silane gas in the chamber at the same time when or after said RF power reaches to the second voltage, thereby said insulating film are formed on said surface to be treated,
   wherein said first voltage is a value so that a transitional current does not flow in or on said surface to be treated until the amount of the charge-up is saturated, and
   wherein said second voltage is a sufficient value to generate organic silane-oxygen plasma.

23. A method according to claim 22, wherein the voltage of said RF power is increased from said first voltage to said second voltage continuously.

24. A method according to claim 22, wherein the voltage of said RF power is increased from said first voltage to said second voltage in a step-like manner.

25. A method according to claim 22, wherein said first voltage of the RF power is half or less than said second voltage of the RF power.

26. A method according to claim 22, wherein said first voltage of the RF power is 50 W and said second voltage of the RF power is 250 W.

27. A method according to claim 22, wherein said organic silane comprises tetraethoxysilane.

28. A method according to claim 22, wherein said insulating film is a silicon dioxide film.

29. A method of manufacturing an active matrix type display device in which a step of forming an insulating film by plasma CVD method comprising steps of:
   preparing a substrate having a surface to be treated in a reaction chamber;
   generating plasma of a first gas by applying an RF power having a first voltage;
   increasing said RF power from said first voltage to a second voltage; and
   supplying a second gas in the chamber at the same time when or after said RF power reaches to the second voltage, thereby said insulating film are formed on said surface to be treated,
   wherein said first voltage is a value so that a transitional current does not flow in or on said surface to be treated until the plasma of the first gas reaches a stationary state, and
   wherein said second voltage is a sufficient value to generate plasma of said first gas and said second gas.

30. A method according to claim 29, wherein the voltage of said RF power is increased from said first voltage to said second voltage continuously.

31. A method according to claim 29, wherein the voltage of said RF power is increased from said first voltage to said second voltage in a step-like manner.

32. A method according to claim 29, wherein said first voltage of the RF power is half or less than said second voltage of the RF power.

33. A method according to claim 29, wherein said first voltage of the RF power is 50 W and said second voltage of the RF power is 250 W.

34. A method according to claim 29, wherein said first gas comprises oxygen.

35. A method according to claim 29, wherein said second gas comprises tetraethoxysilane.

36. A method according to claim 29, wherein said insulating film is a silicon dioxide film.

37. A method of manufacturing an active matrix type display device in which a step of forming an insulating film by plasma CVD method comprising steps of:
   preparing a substrate having a surface to be treated in a reaction chamber;
   generating oxygen plasma by applying an RF power having a first voltage;

increasing said RF power from said first voltage to a second voltage; and supplying tetraethoxysilane gas in the chamber at the same time when or after said RF power reaches to the second voltage, thereby said insulating film are formed on said surface to be treated, wherein said first voltage is a value so that a transitional beard pulse is not observed in voltage waveforms in the moment that the oxygen plasma is generated, and wherein said second voltage is a sufficient value to form said insulating film over said substrate.

38. A method according to claim 37, wherein the voltage of said RF power is increased from said first voltage to said second voltage continuously.

39. A method according to claim 37, wherein the voltage of said RF power is increased from said first voltage to said second voltage in a step-like manner.

40. A method according to claim 37, wherein said first voltage of the RF power is half or less than said second voltage of the RF power.

41. A method according to claim 37, wherein said first voltage of the RF power is 50 W and said second voltage of the RF power is 250 W.

42. A method according to claim 37, wherein said insulating film is a silicon dioxide film.

43. A method of manufacturing a semiconductor device having a thin film transistor in which a step of forming an insulating film by plasma CVD method comprising steps of:

preparing a substrate having a surface to be treated in a reaction chamber;

generating an ion sheath of oxygen on said surface to be treated by applying an RF power having a first voltage, thereby amount of charge-up on the surface to be treated is saturated;

increasing said RF power from said first voltage to a second voltage; and supplying an organic silane gas in the chamber at the same time when or after said RF power reaches to the second voltage, thereby said insulating film are formed on said surface to be treated, wherein said first voltage is a value so that a transitional current does not flow in or on said surface to be treated until the amount of the charge-up is saturated, and wherein said second voltage is a sufficient value to form said insulating film over said substrate.

44. A method according to claim 43, wherein the voltage of said RF power is increased from said first voltage to said second voltage continuously.

45. A method according to claim 43, wherein the voltage of said RF power is increased from said first voltage to said second voltage in a step-like manner.

46. A method according to claim 43, wherein said first voltage of the RF power is half or less than said second voltage of the RF power.

47. A method according to claim 43, wherein said first voltage of the RF power is 50 W and said second voltage of the RF power is 250 W.

48. A method according to claim 43, wherein said organic silane comprises tetraethoxysilane.

49. A method according to claim 43, wherein said insulating film is a silicon dioxide film.

50. A method of manufacturing a semiconductor device having a thin film transistor in which a step of forming an insulating film by plasma CVD method comprising steps of:

preparing a substrate having a surface to be treated in a reaction chamber;

generating plasma of a first gas by applying an RF power having a first voltage;

increasing said RF power from said first voltage to a second voltage; and supplying a second gas in the chamber at the same time when or after said RF power reaches to the second voltage, thereby said insulating film are formed on said surface to be treated, wherein said first voltage is a value so that a transitional beard pulse is not observed in voltage waveforms until the plasma of the first gas reaches a stationary state, and wherein said second voltage is a sufficient value to form said insulating film over said substrate.

51. A method according to claim 50, wherein the voltage of said RF power is increased from said first voltage to said second voltage continuously.

52. A method according to claim 50, wherein the voltage of said RF power is increased from said first voltage to said second voltage in a step-like manner.

53. A method according to claim 50, wherein said first voltage of the RF power is half or less than said second voltage of the RF power.

54. A method according to claim 50, wherein said first voltage of the RF power is 50 W and said second voltage of the RF power is 250 W.

55. A method according to claim 50, wherein said first gas comprises oxygen.

56. A method according to claim 50, wherein said second gas comprises tetraethoxysilane.

57. A method according to claim 50, wherein said insulating film is a silicon dioxide film.

58. A method of manufacturing a semiconductor device having a thin film transistor in which a step of forming an insulating film by plasma CVD method comprising steps of:

preparing a substrate having a surface to be treated in a reaction chamber;

generating oxygen plasma by applying an RF power having a first voltage;

increasing said RF power from said first voltage to a second voltage; and supplying tetraethoxysilane gas in the chamber at the same time when or after said RF power reaches to the second voltage, thereby said insulating film are formed on said surface to be treated, wherein said first voltage is a value so that a transitional current does not flow in or on said surface to be treated in the moment that the oxygen plasma is generated, and wherein said second voltage is a sufficient value to generate tetraethoxysilane/oxygen plasma.

59. A method according to claim 58, wherein the voltage of said RF power is increased from said first voltage to said second voltage continuously.

60. A method according to claim 58, wherein the voltage of said RF power is increased from said first voltage to said second voltage in a step-like manner.

61. A method according to claim 58, wherein said first voltage of the RF power is half or less than said second voltage of the RF power.

62. A method according to claim 58, wherein said first voltage of the RF power is 50 W and said second voltage of the RF power is 250 W.

63. A method according to claim 58, wherein said insulating film is a silicon dioxide film.

* * * * *